(12) United States Patent
Toyoda et al.

(10) Patent No.: US 9,634,231 B2
(45) Date of Patent: Apr. 25, 2017

(54) MEMS SWITCH

(71) Applicant: FUJITSU LIMITED, Kawasaki-shi, Kanagawa (JP)

(72) Inventors: Osamu Toyoda, Akashi (JP); Takeaki Shimanouchi, Akashi (JP)

(73) Assignee: FUJITSU LIMITED, Kawasaki (JP)

( * ) Notice: Subject to any disclaimer, the term of this patent is extended or adjusted under 35 U.S.C. 154(b) by 377 days.

(21) Appl. No.: 14/208,012

(22) Filed: Mar. 13, 2014

(65) Prior Publication Data

US 2014/0191616 A1 Jul. 10, 2014

Related U.S. Application Data

(63) Continuation of application No. PCT/JP2011/005632, filed on Oct. 6, 2011.

(51) Int. Cl.
*H01H 57/00* (2006.01)
*H01L 41/09* (2006.01)
*B81C 1/00* (2006.01)

(52) U.S. Cl.
CPC ........ *H01L 41/094* (2013.01); *B81C 1/00976* (2013.01); *H01H 57/00* (2013.01); *B81B 2201/016* (2013.01); *H01H 2057/006* (2013.01)

(58) Field of Classification Search
CPC ..................... H01H 57/00; H01H 2057/006
(Continued)

(56) References Cited

U.S. PATENT DOCUMENTS

2006/0098059 A1\* 5/2006 Ohguro ................ B81B 3/0018
347/72
2006/0208611 A1 9/2006 Nguyen
(Continued)

FOREIGN PATENT DOCUMENTS

JP 2006-261515 A1 9/2006
JP 2006-346830 A1 12/2006
(Continued)

OTHER PUBLICATIONS

Chinese First Office Action, for the Corresponding CN Application No. 201180073883.3 mailed on Jul. 3, 2015, with partial translation.
(Continued)

*Primary Examiner* — Derek Rosenau
(74) *Attorney, Agent, or Firm* — Kratz, Quintos & Hanson, LLP

(57) ABSTRACT

A MEMS switch has fixed support, a plate-shaped flexible beam having at least one end immovably supported by the fixed support and having an extending movable surface, a movable electric contact disposed on the movable surface of the flexible beam, a fixed electric contact facing the movable electric contact and disposed at a fixed position relative to the fixed support, first piezoelectric driver disposed above the movable surface of the flexible beam, extending from a portion above the fixed support towards the movable electric contact, and capable of displacing the movable electric contact towards the fixed electric contact by voltage driving, and second piezoelectric driver disposed at least on the movable surface of the flexible beam and capable of so driving a movable part of the flexible beam by voltage driving that the movable electric contact is separated from the fixed electric contact.

7 Claims, 12 Drawing Sheets

(58) Field of Classification Search
USPC .................................. 310/330–332; 200/181
See application file for complete search history.

(56) References Cited

U.S. PATENT DOCUMENTS

| | | | |
|---|---|---|---|
| 2006/0220499 A1* | 10/2006 | Ikehashi | .................. H01G 5/18 310/348 |
| 2006/0226735 A1* | 10/2006 | Ikehashi | .................. H01G 5/18 310/311 |
| 2006/0285255 A1 | 12/2006 | Kawabuko | |
| 2007/0024403 A1 | 2/2007 | Kwon | |
| 2008/0042518 A1* | 2/2008 | Liu | .................... H01H 59/0009 310/319 |
| 2009/0212664 A1 | 8/2009 | Nguyen | |

FOREIGN PATENT DOCUMENTS

| | | | |
|---|---|---|---|
| JP | 2007-35640 | A1 | 2/2007 |
| JP | 2008-177074 | A1 | 7/2008 |

OTHER PUBLICATIONS

International Search Report for International Application No. PCT/JP2011/005632 dated Nov. 1, 2011.
Japanese Office Action, for the Corresponding JP Application No. 2013-537277, mailed on Jun. 23, 2015, with partial translation.

* cited by examiner

MEMS SWITCH

CROSS REFERENCE TO RELATED APPLICATIONS

This application is a continuation application of the prior International Application No. PCT/JP2011/005632, filed on Oct. 6, 2011, the entire contents of which are incorporated herein by reference.

FIELD

The present invention relates to a MEMS (micro electromechanical system) switch. The term MEMS refers to electromechanical part having a component of a size of 10 mm or less.

BACKGROUND

Silicon processing technology has been rapidly developing with advances in integrated circuits, and is adapted for production of MEMS. An SOI substrate prepared by adhering an active Si layer over an Si support substrate using a silicon oxide film (bonding oxide film, BOX film) can reduce the thickness of the active Si film. Thus, dielectric isolation high performance Si element can be manufactured. Silicon oxide film can be selectively removed by diluted fluoric acid, etc., and thus SOI substrate can be used for manufacturing MEMS having movable part. An SOI substrate is generally made by thermally oxidizing at least one of a pair of Si substrates and bonding them via silicon oxide film by thermocompression.

To meet requirements of size reduction and performance enhancement for high-frequency (RF) parts of mobile phones etc., research and development on RF signal switches using MEMS technology are vigorously performed. An MEMS switch can be manufactured by patterning the active Si layer of an SOI substrate in a stripe shape and removing the bonding oxide film to form a flexible beam, and forming a movable contact on the flexible beam and a fixed contact above the flexible beam. The flexible beam may have either a cantilever (single-end supported) beam structure or a both-end supported beam structure. Since a MEMS switch is a mechanical switch, it can keep the parasitic capacitance small, is accompanied with smaller loss, has higher insulation property, and has better distortion characteristics for signals, compared to a semiconductor element-based switch.

It is possible to form a flexible cantilever beam by patterning the active silicon layer of an SOI substrate into a cantilever beam shape and removing the BOX film under the cantilever beam by etching. It is possible to constitute a switch by forming a movable electrode on the cantilever beam and a fixed electrode extending above the movable electrode and making the cantilever beam deformable upwards. As means for deforming the flexible cantilever beam upwards, there are known method using a piezoelectric actuator, method using an electrostatic actuator, etc. (for example, Japanese Laid-Open Patent Publication (JPA) No. 2006-261515).

As illustrated in FIG. 11A, it is possible to form an elastic cantilever beam CL by patterning an active silicon layer AL provided with an insulation layer on its surface and removing the bonding oxide film BOX thereunder. A movable contact electrode MCE is formed on the top end of the front surface of the cantilever beam CL, and at the same time an underlying electrically conductive layer is formed in a desired region. A fixed contact electrode FCE extending to the movable contact electrode MCE from a fixed part is formed to provide a pair of contacts for the switch. In the region from the proximal end of the cantilever beam CL to an intermediate position, a piezoelectric actuator PEA, including a lead zirconate titanate (PZT) or other piezoelectric material layer PEL sandwiched between a pair of driving electrodes, LE and UE, is formed. Plated metal layers PL1, PL2 and PL3 are formed in the terminal regions. A bias voltage source V is connected between plated metal layers PL2 and PL3.

When a voltage V is applied between the electrodes UE and LE of the piezoelectric actuator PEA from the bias voltage source V as illustrated in FIG. 11B, the piezoelectric material layer PEL increases its size in the direction of the electric field (thickness) and at the same time reduces its in-plane size to maintain the volume constant.

As illustrated in FIG. 11C, reduction in the in-plane size of the piezoelectric actuator PEA applies a contractive stress in the top surface of the cantilever beam CL. The cantilever beam CL is deformed to bend or warp upwards. Extending the proximal end of the piezoelectric actuator PEA from the fixed end of the cantilever beam CL towards the fixed region of the active silicon layer will enlarge the upward displacement of the cantilever beam CL at the other end.

As illustrated in FIG. 11B, as the cantilever beam CL warps upward, the movable contact electrode MCE comes in contact with the fixed contact electrode FCE to turn on the switch. When the application of a voltage to the piezoelectric material layer is stopped, the contractive stress disappears, and the cantilever beam CL loses warping due to the elasticity of the cantilever beam CL. The movable contact electrode MCE is detached or separated from the fixed contact electrode FCE, to turn off the switch.

In place of a piezoelectric drive mechanism, an electrostatic drive mechanism may be used. A movable electrode is formed on the top surface of the flexible beam and a fixed electrode is formed above the movable electrode to constitute a switch having an electrostatic drive. The flexible beam can be displaced upward by electrostatic attraction between the electrodes, to close the contacts, thereby turning on the switch.

If a MEMS switch repeats such on/off motions numerous times, such phenomenon as called sticking can occur that closed contact points can not be separated. The MEMS switch cannot be turned off by the elastic restorative force of the beam. Sticking may more easily occur as the elastic restorative force of the beam is small. To prevent sticking, it is desirable to increase the elastic restorative force of the beam. However, it is desirable to reduce the drive voltage (turn-on voltage) of the switch. For lowering the drive voltage of the switch, it is advantageous to decrease the elastic restorative force of the beam as low as possible.

For reducing the turn-on voltage and preventing sticking, it can be considered to introduce a drive mechanism for separating the closed contacts. For example, it is possible to provide a flexible beam with a piezoelectric drive mechanism and an electrostatic drive mechanism and to use one for closing the contacts and to separate the closed contacts (for example, JPA No. 2007-35640).

As illustrated in FIG. 12, a flexible beam CL is projected from support SP disposed on a support substrate SS, a movable contact electrode MCE and a movable driving electrode MDE are disposed on a lower surface of the flexible beam CL, and a fixed contact electrode FCE and a fixed driving electrode FDE are disposed on an upper surface of the substrate in face-to-face relation. The switch can be turned on by applying a voltage between driving electrodes MDE and FDE, to close the contact electrodes MCE and FCE by electrostatic attraction.

A piezoelectric material layer PEL is formed on an upper surface of the flexible beam CL and opposing (inter-digital) comb-shaped electrodes CEA and CEB are formed on an upper surface of the piezoelectric material layer, to form a piezoelectric drive mechanism for turning off the switch. When turning the switch off, not only the voltage applied between the driving electrodes MDE and FDE is turned off, a voltage is additionally applied between the comb-shaped electrodes CEA and CEB to generate a force which contracts the piezoelectric material layer PEL, and warp the flexible beam CL upward, to positively separate the contact electrodes MCE and FCE.

By providing two drive mechanisms as described above, it is possible to generate a force which separates the contact electrodes when the switch is to be turned off, thus preventing sticking. However, with the configuration illustrated in FIG. 12, it is necessary to form opposing electrodes in narrow gap between the flexible beam and the substrate. This puts severe restriction on the manufacturing processes. In the case of forming a flexible beam through the use of the active Si layer of an SOI substrate, the configuration will be difficult to realize.

SUMMARY

One object of the embodiment of this invention is to provide a MEMS switch that is easy to manufacture and can effectively suppress sticking.

According to one embodiment, a MEMS switch has, fixed support, a plate-shaped flexible beam having at least one end immovably supported by the fixed support and having an extending movable surface, a movable electric contact disposed on the movable surface of the flexible beam, a fixed electric contact facing the movable electric contact and disposed at a fixed position relative to the fixed support, first piezoelectric driver disposed above the movable surface of the flexible beam, extending from a portion above the fixed support towards the movable electric contact, and capable of displacing the movable electric contact towards the fixed electric contact by voltage driving, and second piezoelectric driver disposed at least on the movable surface of the flexible beam and capable of so driving a movable part of the flexible beam by voltage driving that the movable electric contact is separated from the fixed electric contact.

DESCRIPTION OF EMBODIMENTS

Discussion will be made on the case of deforming a flexible beam by unimorph type piezoelectric drive mechanism having a simple structure of sandwiching a piezoelectric material layer between upper and lower electrode layers. The force induced by the piezoelectric drive mechanism as a result of the application of a voltage occurs in one direction and so does the deformation of the laminated structure of the flexible beam and piezoelectric drive mechanism.

Figure 1A:
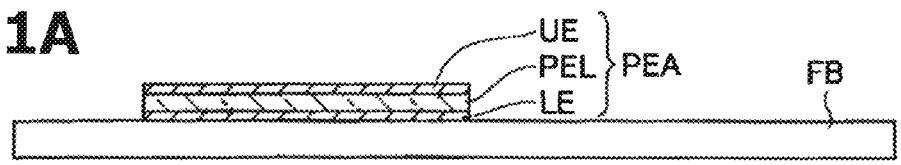
FIGS. 1A-1E are cross-sectional views of a flexible beam illustrating the contents of analysis by the inventors.

Consideration will be made on a structure in which a lower electrode LE of Pt etc., piezoelectric material layer PEL of lead zirconate titanate (PZf) etc., and an upper electrode UE of Pt etc., are laminated on a surface of a plate-shaped flexible beam FB to form a piezoelectric drive mechanism PEA, as depicted in FIG. 1A.

This piezoelectric drive mechanism PEA increases the thickness and decreases the in-plane size (length) (a contraction in the in-plane direction) of the piezoelectric material layer PEL upon application of a voltage between the upper electrode UE and the lower electrode LE.

Figure 1B:
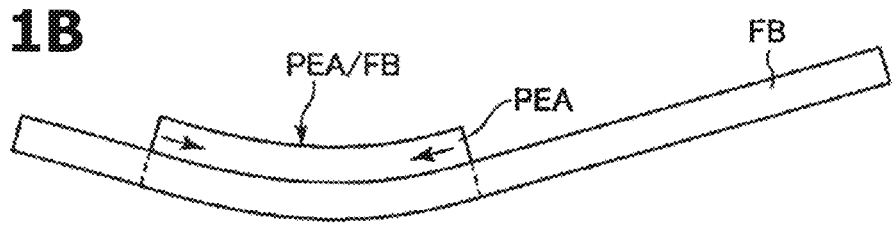

As illustrated in FIG. 1B, the laminated structure of the flexible beam FB and piezoelectric drive mechanism PEA deforms into a downwardly convex shape (central portion projecting downward than adjacent portions) as a result of the longitudinal contraction of the piezoelectric drive mechanism PEA. If the flexible beam FB and piezoelectric drive mechanism PEA have a stripe shape long in the lateral direction in the figure, deformation in the lateral (longitudinal) direction becomes large. As the piezoelectric drive mechanism PEA contracts, the laminated portion PEA/FB of the flexible beam FB deforms into a downwardly convex shape due to the contraction of the upper side piezoelectric drive mechanism PEA. The portion of the flexible beam FB located outside of the piezoelectric drive mechanism PEA retains its straight elongated shape without any deformation, provided that it is in free state.

Figure 1C:
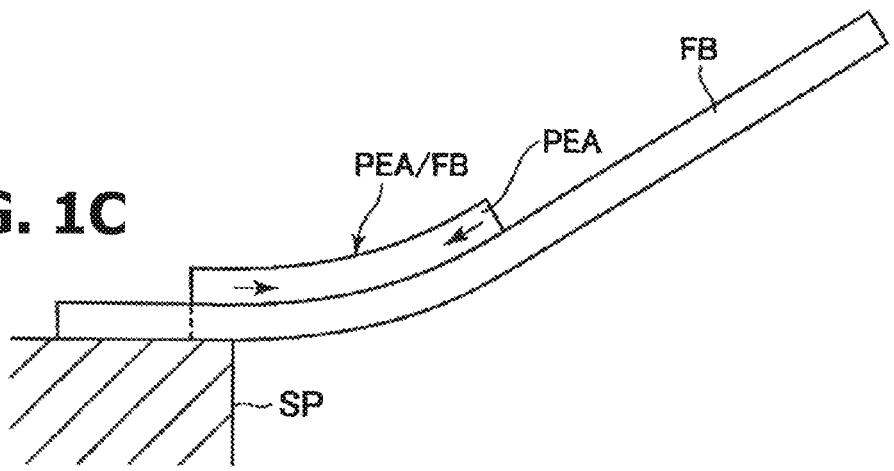

If one end portion of the flexible beam FB, for example the left left end portion, is supported horizontally on support part SP, as illustrated in FIG. 1C, the supported portion will not be deformed, and other portion in free state will be deformed or displaced. Namely, the left end portion of the piezoelectric drive mechanism PEA is maintained horizontally, and the downward convex bending displaces the right side portion of the flexible beam FB upwardly in larger degree.

Figure 1D:
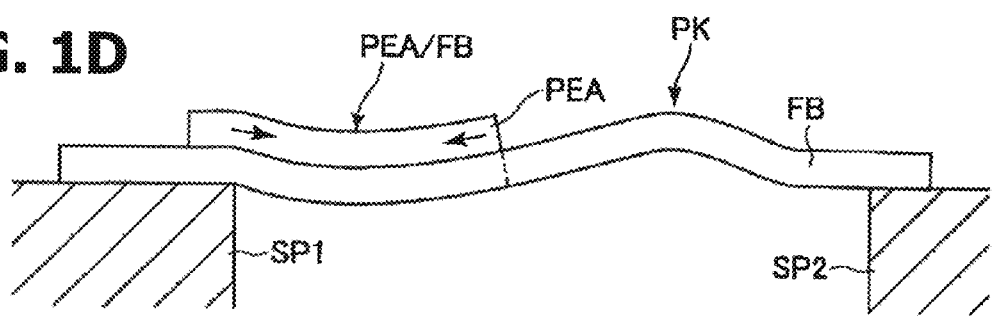

The case wherein the both ends of a flexible beam are supported by supports SP1 and SP2 as illustrated in FIG. 1D will be studied. Both ends of the flexible beam FB are fixed in horizontal state. It is assumed that the piezoelectric drive mechanism PEA is formed from above the left side support SP1 toward a central portion of the flexible beam FB. When the piezoelectric drive mechanism PEA is contracted by voltage application, the lamination PEA/FB of the piezoelectric drive mechanism and the flexible beam FB tends to deform in convex shape downward. As the associated force tends to displace the portion of the laminated structure on the right side of the support SP1 upward, the right end portion of the flexible beam fixed to the right side support SP2 exhibits resistive force. The lamination PEA/FB of the piezoelectric drive mechanism and the flexible beam will then deform downward to a position where the two forces are balanced. In a portion on the right side of the left support SP1, the lamination PEA/FB of the piezoelectric drive mechanism and the flexible beam once sink downward to suppress the upward displacement in a portion on side of the right support SP2. Portion of the flexible beam FB on further right side would normally go straight upwardly toward right, but receives resistance from the right support SP2. Thus, the flexible beam FB will be deformed convex upward, and then convex downward, to continue to the horizontal portion on the right support SP2. Here, there will be formed a peak PK in the height distribution of the flexible beam FB. Disposing a movable contact at the peak portion PK will be effective to lower the (on) voltage for generating a certain displacement. If the voltage applied to the piezoelectric drive mechanism PEA is removed, the deformation driving force of the piezoelectric drive mechanism PEA disappears, and the flexible beam FB returns to the straight state, turning off the MEMS switch.

Sticking is a phenomenon in which turned-on MEMS contacts will not be separated. However, even when the restorative force of the flexible beam FB is insufficient to separate the movable electric contact from the fixed electric contact, it is often possible to separate the movable electric contact from the fixed electric contact by applying another driving force. It will be effective in suppressing sticking if a downward force can be acted on the peak PK when the switch is changed over from the on state as illustrated in FIG. 1D to the off state.

As illustrated in FIG. 1B, a piezoelectric drive mechanism PEA mounted on top of the free state flexible beam FB exhibits deformation in downwardly concave shape upon application of a voltage. Focusing on the middle part of the piezoelectric drive mechanism PEA, there is generated a downward displacement.

Figure 1E:
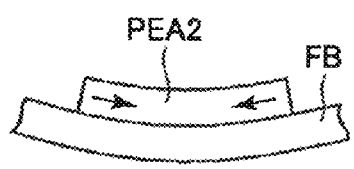

FIG. 1E illustrates a case in which a piezoelectric drive mechanism PEA2 is formed in vicinity of the movable electric contact. The piezoelectric drive mechanism PEA2 is formed on the flexible beam FB in a region containing the pair of contacts of the MEMS switch. The application of a voltage causes the piezoelectric drive mechanism to contract and deforms the lamination of piezoelectric drive mechanism PEA2/flexible beam FB into downwardly convex shape, displacing the middle portion of the REA2/FB lamination downward. If the contact is disposed in middle portion of the laminate REA2/FB, downward force acts on the contact, suppressing sticking.

Figure 2A:
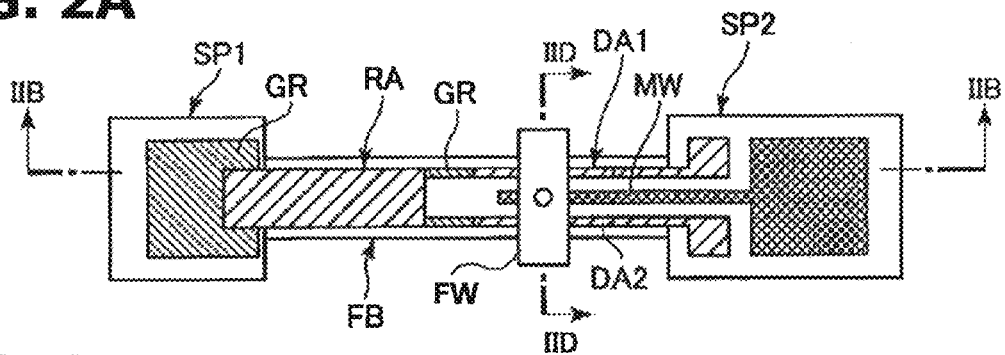
FIGS. 2A-2D are a plan view, a cross-sectional view along the line IIB-IIB, a perspective view, and a cross-sectional view along the line IID-IID, illustrating a MEMS switch according to the first embodiment.
Figure 2B:
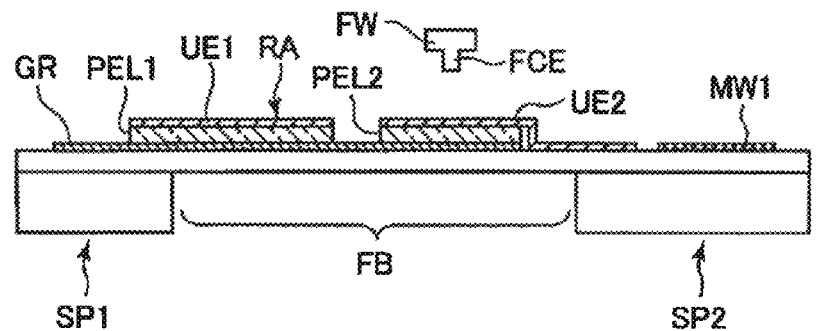
Figure 2C:
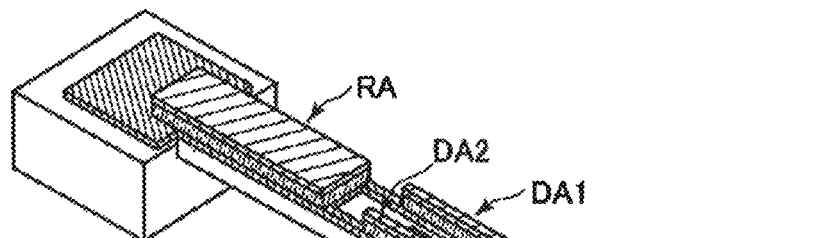
Figure 2D:
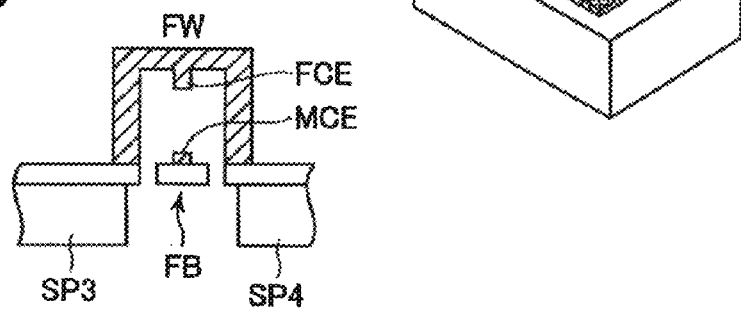

FIGS. 2A-2D illustrate a MEMS switch according to the first embodiment. FIG. 2A is a plan view as viewed from above, FIG. 2B is a cross-sectional view along the line IIB-IIB in FIG. 2A, FIG. 2C is a perspective view, and FIG. 2D is a cross-sectional view along the line IID-IID in FIG. 2A.

As illustrated in FIGS. 2A and 2B, a flexible beam FB is supported by left and right supports SP1 and SP2, and bridge-shaped fixed wiring FW provided with a fixed contact FCE of the switch is placed astride or crossing over a middle portion of the flexible beam FB. As illustrated in FIG. 2D, a movable contact MCE is disposed on the flexible beam FB opposing the fixed contact FCE. The fixed wiring FW is supported by supports SP3 and SP4, located on both sides of the flexible beam FB. The movable contact MCE is connected to movable side wiring MW illustrated in FIGS. 2A and 2B.

As illustrated in FIG. 2B, ground wiring GR is formed on the flexible beam from above the support SP1 through a middle portion of the flexible beam to a region separated from the support SP2. As illustrated in FIG. 2A, the ground wiring GR comprises a single wide wiring on the proximal portion of the flexible beam, and two thin wirings in front portion, defining space for accommodating the movable contact between them.

As illustrated in FIG. 2B, a piezoelectric material layer PEL1 and an upper electrode UE1 are formed on the wide ground wiring GR from above the support SP1 to a middle portion of the flexible beam FB, constituting a raising (turn-on) actuator RA. When a voltage is applied between the upper electrode UE1 and the ground wiring GR, the raising actuator RA raises top portion to cause deformation, as illustrated in FIG. 1D, in which the movable contact MCE is located at the peak PK.

As illustrated in FIG. 2B, a piezoelectric material layer PEL2 and an upper electrode UE2 are formed on each of the thin ground wirings GR separated from the raising actuator RA, constituting two lowering or pulling down (turn-off) actuators DA1 and DA2 as illustrated in FIG. 2A. The relative disposition of the raising actuator RA and the lowering actuators DA1 and DA2 will be clear from the perspective view of FIG. 2C.

The piezoelectric drive element RA from above the left-side support to the middle portion of the both-ends supported flexible beam exerts a driving force which drives the movable contact MCE upward, and the piezoelectric drive elements DA1 and DA2 located on both sides of the movable contact MCE exert a driving force which lowers the movable contact MCE.

Figure 3C:
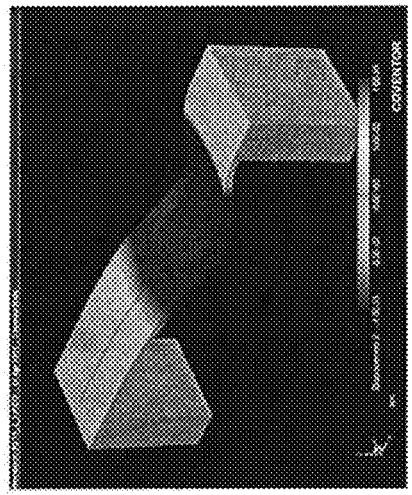
FIGS. 3A-3D are perspective views and cross-sectional views illustrating deformation of a flexible beam obtained by simulation.
Figure 3D:
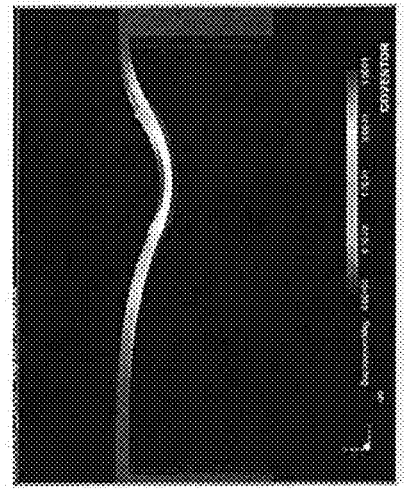
Figure 3A:
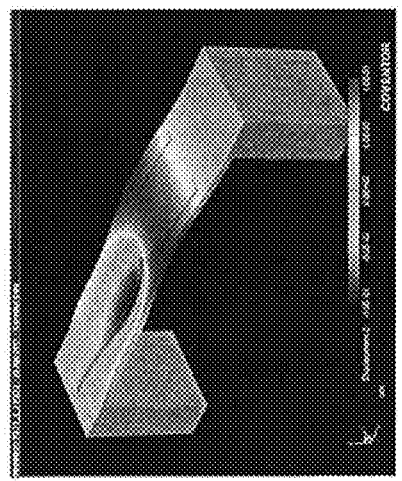
Figure 3B:
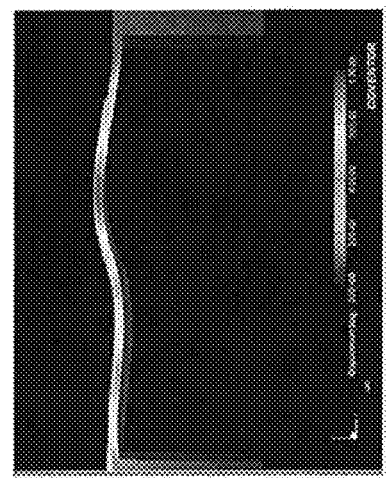

FIGS. 3A-3D illustrate the deformation of a flexible beam obtained by simulation. FIGS. 3A and 3B are a perspective view and a cross-sectional view of the flexible beam when the raising actuator RA is driven, and FIGS. 3C and 3D are a perspective view and a cross-sectional view of the flexible beam when lowering actuators DA1 and DA2 are driven. It can be seen that, when the raising actuator is driven, the actuator portion is depressed into an egg-like shape, and a peak is formed on far side. It can also be seen that, when the lowering actuators are driven, the peak portion is depressed to cause deformation downwardly convex. Although the case where two lowering actuators are disposed on both sides of the movable contact has been described, two lowering actuators are not essential. One of the lowering actuators may be dispensed with. Still, it is preferable to dispose two lowering actuators on both sides of the movable contact, since they will exert more uniform force on the flexible beam.

The manufacturing processes of the MEMS switch according to the first embodiment will be described, referring to cross-sectional views of FIGS. 4A-4E, and plan views of FIGS. 5A and 5B.

Figure 4A:
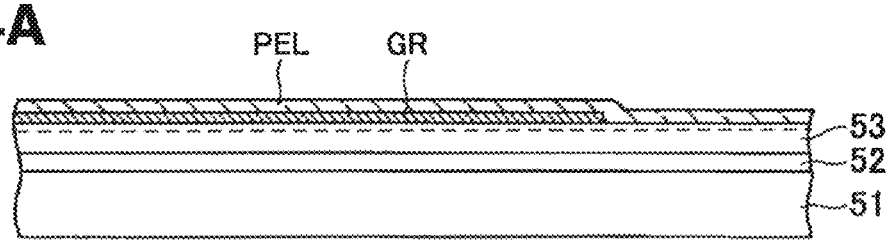
FIGS. 4A-4E are cross-sectional views of an SOI substrate illustrating manufacturing processes of a MEMS switch according to the first embodiment.

An SOI substrate is prepared, in which a high-resistivity active single crystal Si layer 53, for instance 10 μm to 20 μm in thickness and 500 Ωcm or more in resistivity, is bonded to a single crystal Si substrate 51, for instance 300 μm to 500 μm in thickness, via a bonding silicon oxide film 52, for instance 10 μm to 50 μm in thickness, as illustrated in FIG. 4A. It is assumed that the surface of the active Si layer 53 is covered with an insulating film such as a silicon oxide layer. A Pt layer is deposited on the surface of the active Si layer 53 to a thickness of 300 nm to 1000 nm by sputtering. A resist pattern is formed on the Pt layer. Portions of the Pt layer outside of the resist pattern is removed by milling using Ar, patterning the Pt layer to form the ground wiring GR. The patterning of the Pt layer may alternatively be carried out by first forming resist pattern on the active Si layer 53, sputtering a Pt layer, and then removing the Pt layer on the resist pattern by lift-off. A piezoelectric material layer PEL, such as PZT, of 1 μm to 3 μm in thickness is formed above the active Si layer, covering the patterned ground conductor GR, for example by sputtering. The PZT layer may be formed by the sol-gel method. The PZT film formed on the Pt lower electrode has aligned crystal orientation, and exhibits strong ferroelectric and piezoelectric characteristics.

Figure 4B:
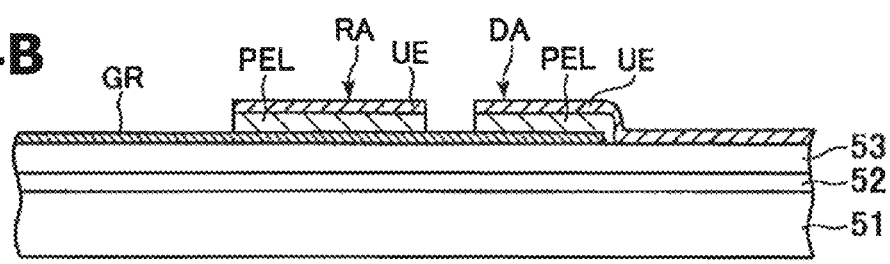

The piezoelectric material layer PEL is patterned as illustrated in FIG. 4B. A resist pattern is formed on the piezoelectric material layer PEL, and the Pt layer is patterned by etching using an HF-based etchant. Alternatively, it is possible to pattern the Pt layer by milling. A Pt layer of 300 nm to 1000 nm in thickness is deposited above the active Si layer 53, covering the patterned Pt layer PEL, by sputtering. The upper electrode UE will be formed by patterning the Pt layer. A resist pattern is formed on the upper electrode UE, and the Pt layer is patterned by milling using Ar. It is also possible to pattern the Pt layer by lift-off. The structures of the raising actuator RA and the lowering actuators are formed on the ground wiring GR.

Figure 5A:
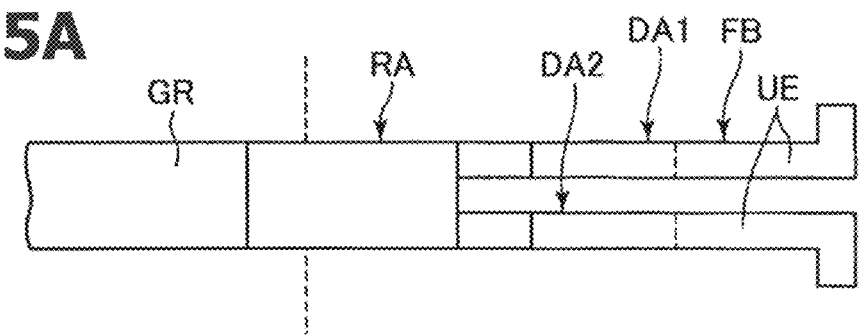
FIGS. 5A and 5B are plan views of an SOI substrate illustrating the manufacturing processes of a MEMS switch according to the first embodiment.

FIG. 5A is a plan view illustrating the state when the raising actuator RA and the lowering actuators DA1 and DA2 are formed on the flexible beam FB. The flexible beam FB has not yet been patterned.

Figure 4C:
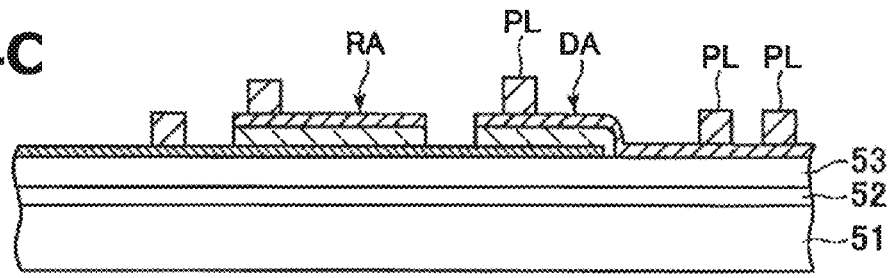

A seed layer of Ti/Au-lamination is formed all over the active Si layer 53, and a resist pattern having apertures in the plating region is formed on it. Au electrolytic plating is performed in the apertures defined by the resist pattern to form Au-plated layer PL for electrode pads and the bridge pillars of the fixed wiring FW illustrated in FIG. 2D. Thereafter, the resist pattern is removed using a resist remover, ashing, etc., and the exposed seed layer is also removed using an ammonium fluoride-based solution or the like, as illustrated in FIG. 4C.

Figure 4D:
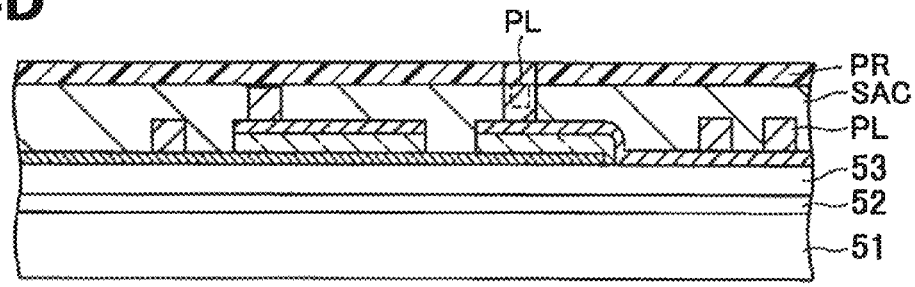

As illustrated in FIG. 4D, a sacrificial layer SAC of silicon oxide etc. is formed above the active Si layer 53 by chemical vapor deposition (CVD), and etching is done to expose the surface of the fixed contact FCE and the upper surface of the Au-plated layer of the bridge pillars of the fixed wiring. A seed layer is formed on patterned sacrificial layer, and a resist pattern PR defining the plating region is formed. Electrolytic plating of Au layer PL is performed. Fixed wiring FW as illustrated in FIG. 2D is completed.

Figure 4E:
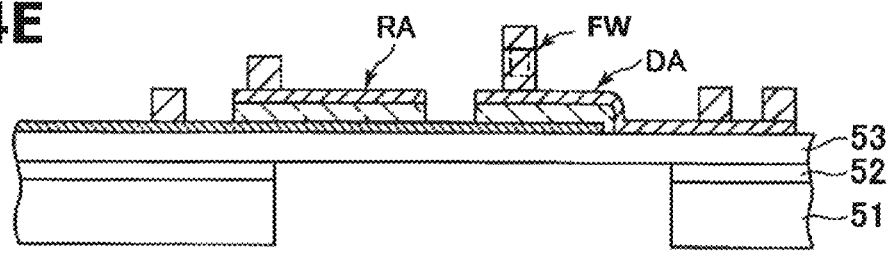

As illustrated in FIG. 4E, the MEMS switch structure is exposed by removing the resist pattern PR using a resist remover etc. and the sacrificial layer SAC using an HF solution etc. On the active Si layer, a switch including a movable contact and a fixed contact, a raising actuator RA, and lowering actuators DA have been formed.

Figure 5B:
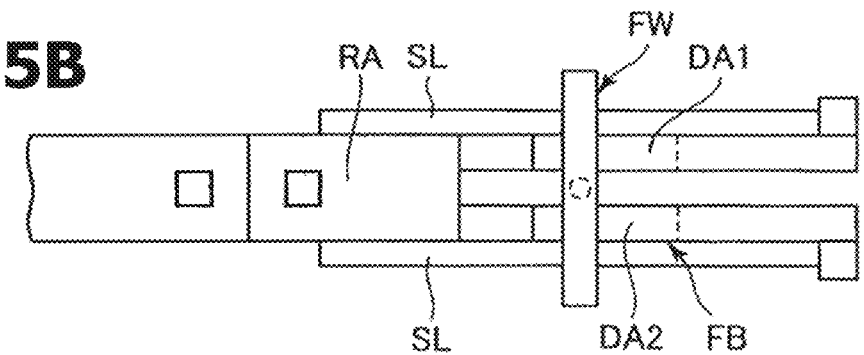

As illustrated in FIG. 5B, slits SL that penetrate through the active Si layer 53 and demarcate the flexible beam FB are formed by dry etching of so-called deep RIE (reactive ion etching) (Bosch process).

As illustrated in FIG. 4E, an aperture that penetrates through the Si support substrate 51 and the bonding silicon oxide film 52 and exposes the flexible beam FB is formed by deep RIE dry etching from the rear surface.

Figure 6A:
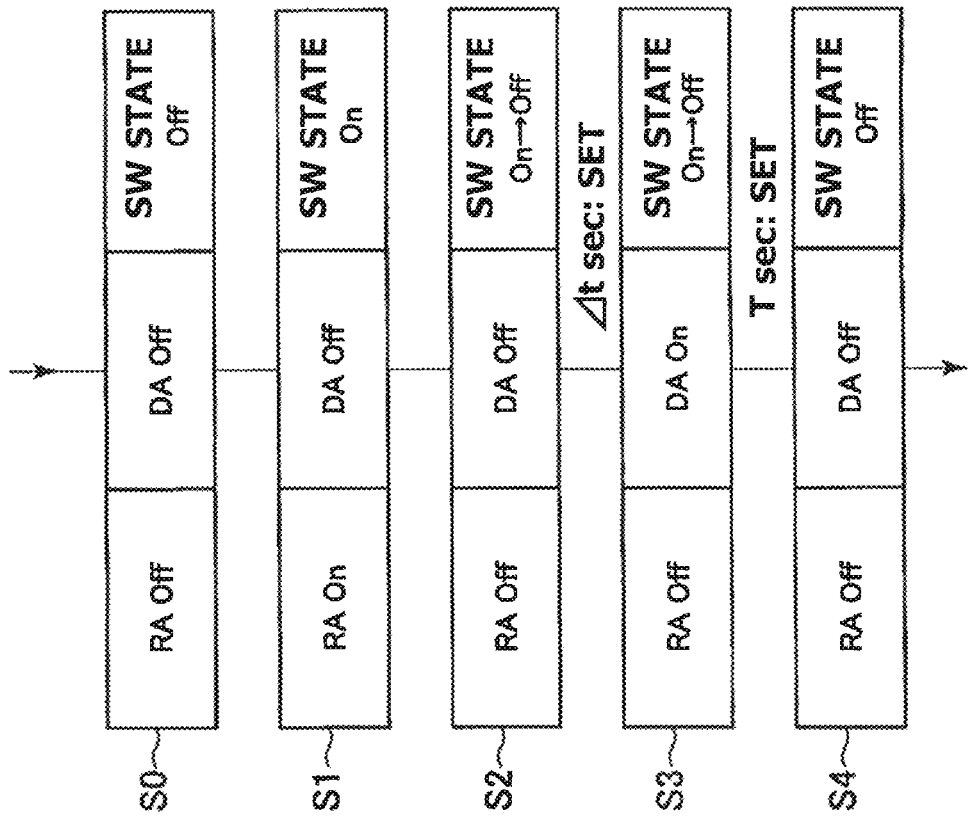
FIGS. 6A and 6B are an equivalent circuit diagram of the drive circuit and a flow chart of switch driving according to the first example.

FIG. 6A illustrates a controller of the MEMS switch according to the first example. The controller CTL includes a microprocessor including a timer, and controls the timing of connecting the first voltage source V1 with the raising actuator RA and the timing of connecting the second voltage source V2 with the lowering actuators DA.

Figure 6B:
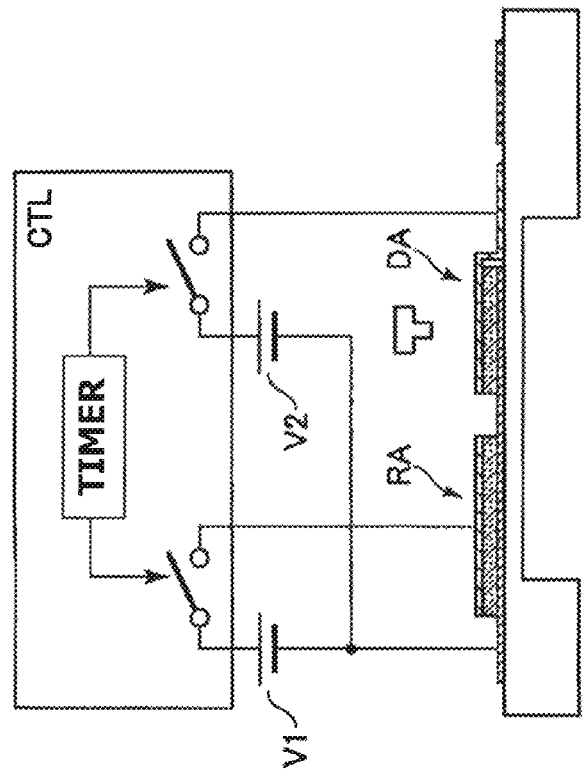

FIG. 6B is a flowchart of control. Step S0 represents off state of the switch in which both the raising actuator RA and the lowering actuator DA are turned off. In step S1, the switch state is changed to on, and the raising actuator RA is turned on. The lowering actuators DA are kept off. In step S2, in the first phase of changing the switch state from on to off (switching off), the raising actuator RA is turned off. The lowering actuators DA are kept off. In step S3, in the second phase of changing the switch state from on to off (switching off), the lowering actuators DA are turned on upon lapse of Δt seconds after the raising actuator RA was turned off. In the state wherein the raising force of the raising actuator RA is extinguished, a voltage is applied to the lowering actuators DA to generate pulling-down force on the movable contact. In step S4, in which the switch state shifts to the normal off state, the lowering actuators DA are turned off T seconds after they were turned on. The raising actuator RA is kept off.

Figure 7A:
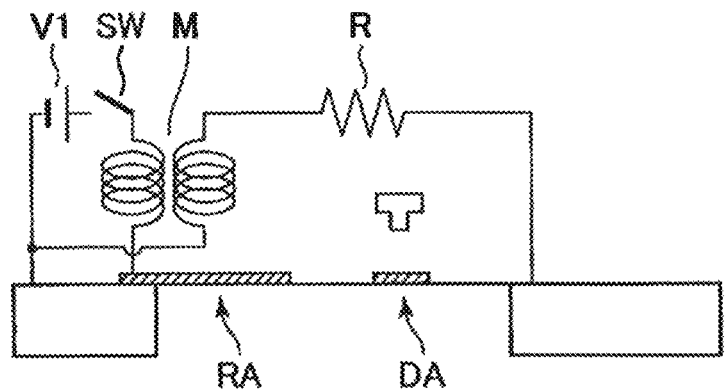
FIGS. 7A, 7B and 7C are cross-sectional views illustrating switch driving using a mutual inductance element.
Figure 7B:
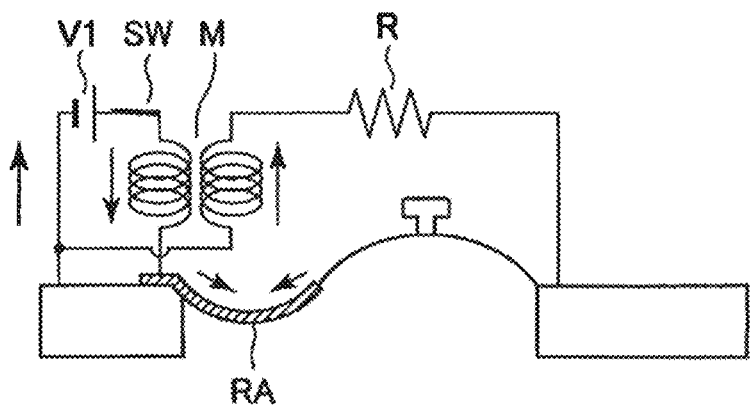
Figure 7C:
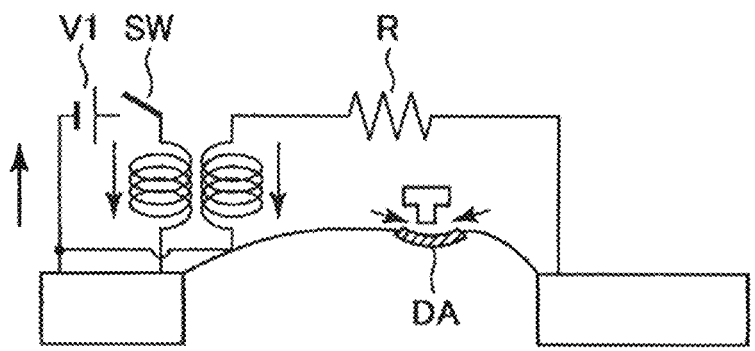

FIGS. 7A, 7B and 7C illustrate a case in which a mutual inductance element is used to provide a similar control to FIGS. 6A and 6B with simpler structure.

As illustrated in FIG. 7A, a voltage source V1 is connected to the raising actuator RA via a switch SW and the primary side of a mutual inductance element M. The secondary side of the mutual inductance element M is always connected to the lowering actuator DA via a resistance R. When the switch SW is turned on as illustrated in FIG. 7B, the voltage V1 is applied to the raising actuator RA, and the raising actuator RA is brought into on state and raises the movable contact, turning the micro switch on. Though an induced electric current flows in the secondary side of the mutual inductance element, it is limited by the resistance R, so that the lowering force is small compared to the raising force.

As illustrated in FIG. 7C, the switch SW is turned off to stop (switch off) the voltage applied to the raising actuator RA. The current flowing through the primary side of the mutual inductance element M drops sharply, and an electromotive force is generated on the secondary side. With the raising actuator RA no longer exerting a raising force, a voltage is applied to the lowering actuators DA, and a lowering force acts on the movable contact. The restorative force of the flexible beam and the lowering force of the lowering actuators collectively act on the flexible beam, and hence sticking is effectively suppressed. This makes it possible to activate the lowering actuators without using operation circuit. A single power source is sufficient for the total control.

Figure 8A:
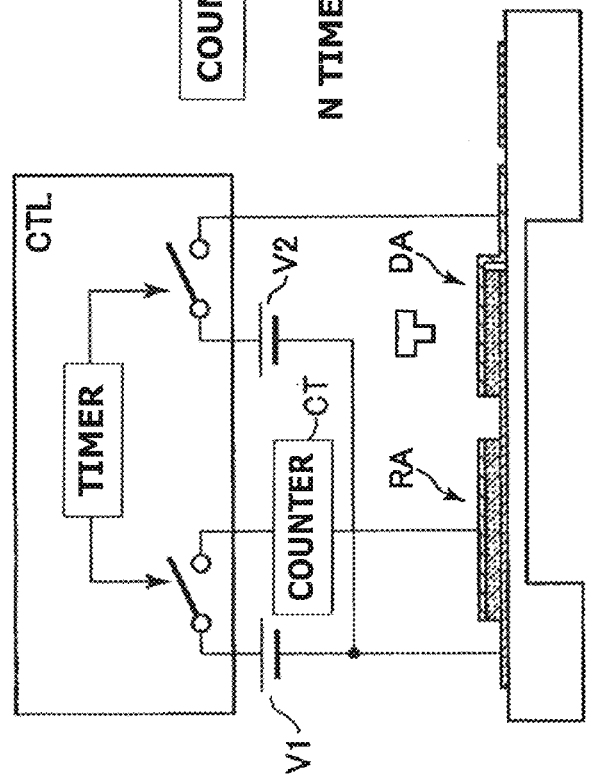
FIGS. 8A and 8B are an equivalent circuit diagram of the drive circuit and a flow chart of switch driving according to the second example.

FIG. 8A illustrates the control circuit of the MEMS switch according to the second embodiment. Compared to the control circuit illustrated in FIG. 6A, a counter CT has been added to the drive circuit of the raising actuator RA.

Figure 8B:
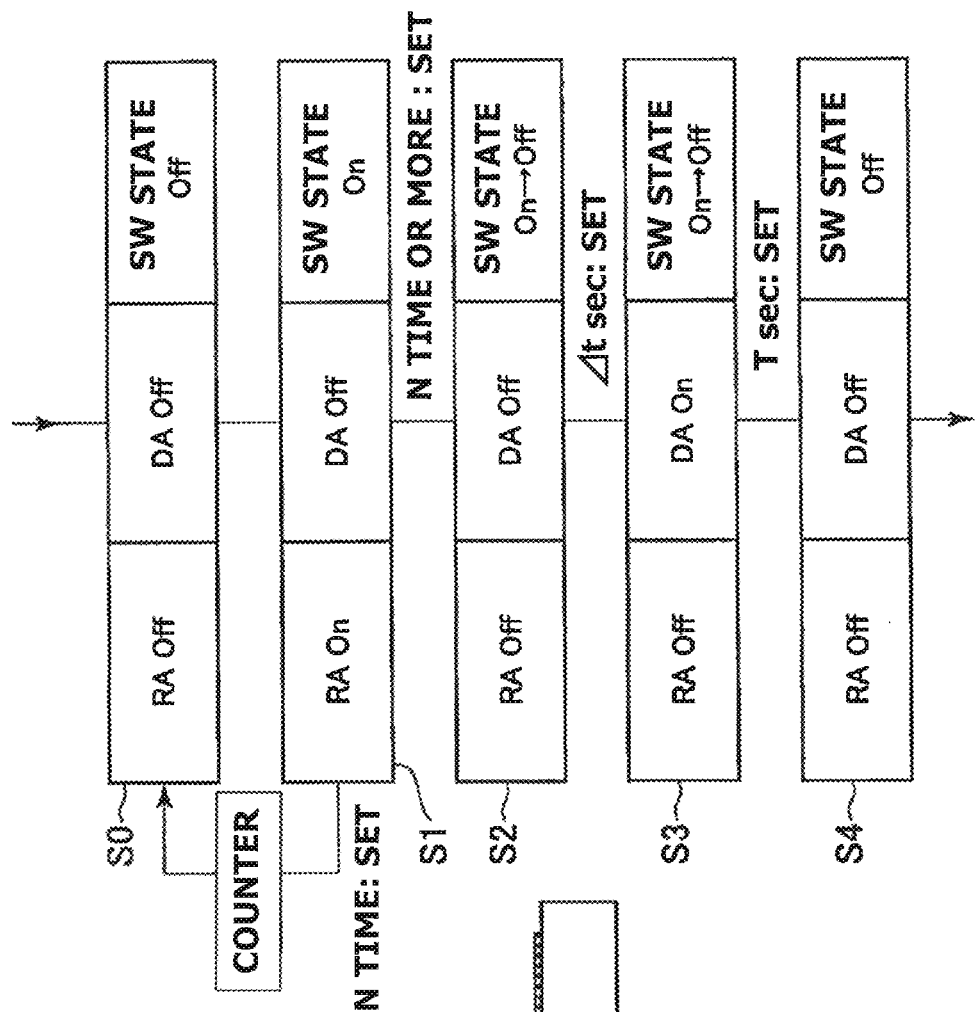

FIG. 8B is a flowchart of control. A counter step is added. Steps S0-S4 themselves are the same as steps S0-S4 illustrated in FIG. 6B. Step S1 follows step S0 (off state), and the raising actuator RA is driven. After step S1, control returns to step S0 through counter step. When the counter is set to count N, step S1 checks this count, number of operation. Up to the count (N−1), the step S0 follows the step S1. At the Nth time, step S1 allows to progress to steps S2 and S3 to drive the lowering actuators DA. This reduces the frequency of the activation of the lowering actuator to 1/N, which is advantageous in that it mitigates increased contact wear and other side effects of the use of a lowering actuator.

Figure 9A:
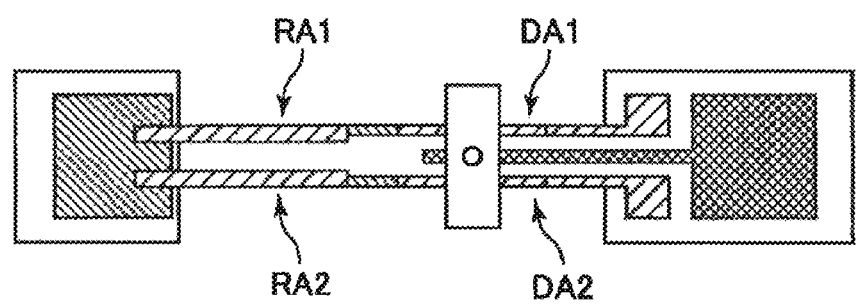
FIGS. 9A and 9B are a plan view and a cross-sectional view illustrating a MEMS switch according to a modified example.
Figure 9B:
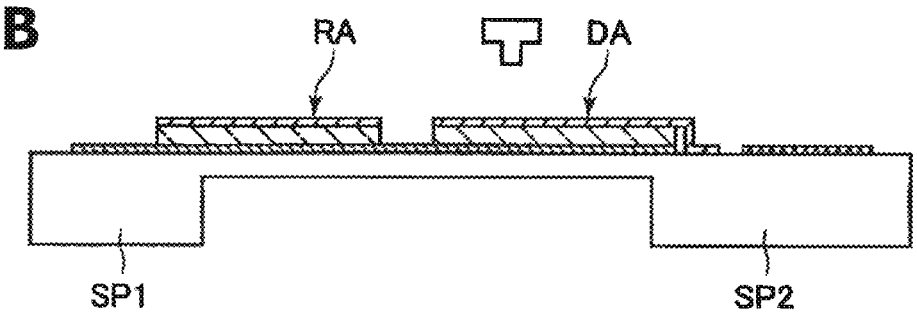

FIGS. 9A and 9B are a plan view and cross-sectional view illustrating a MEMS switch according to two modified embodiments.

In the first embodiment, a single wide raising actuator RA was used.

In the modified embodiment illustrated in FIG. 9A, two raising actuators RA1 and RA2 are disposed along the both sides of the flexible beam. This makes it possible to form the raising actuator RA and lowering actuator DA with structures of the same width. A single wide piezoelectric actuator causes an egg-shaped deformation to the flexible beam (see FIG. 3A). A pair of parallel piezoelectric actuators mainly generates deformation along the longitudinal direction, and decreases deformation in the width direction (see FIG. 3C).

In the modified embodiment illustrated in FIG. 9B, the lowering actuators DA extend in the longitudinal direction, from a region including a movable contact to a region above the right support SP2. The portion of the beam where the piezoelectric actuators exist deform in downwardly convex shape. It is possible to generate a downward force even when the actuators are disposed partially above the support.

Figure 10A:
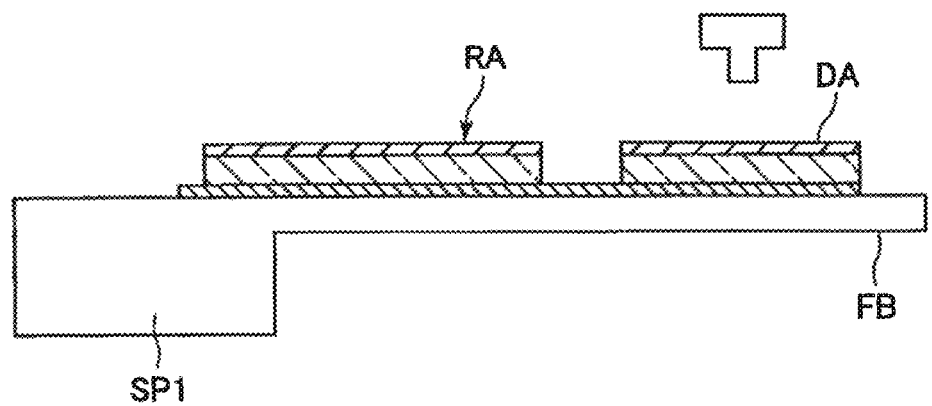
FIGS. 10A and 10B are a plan view and a cross-sectional view illustrating a MEMS switch according to the second embodiment.
Figure 10B:
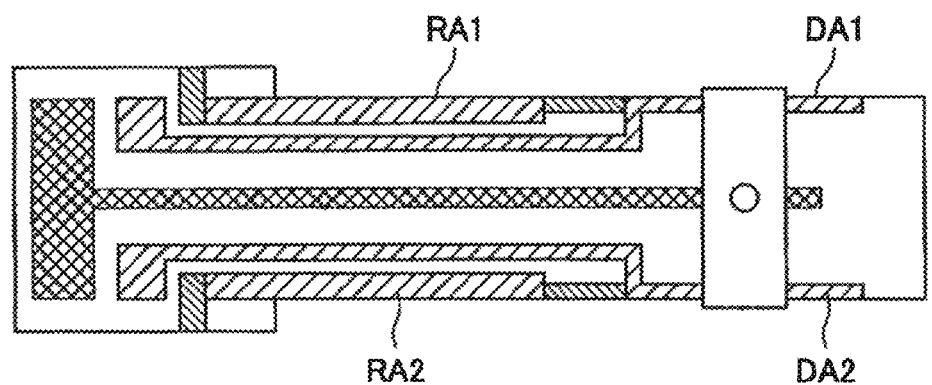
Figure 11A:
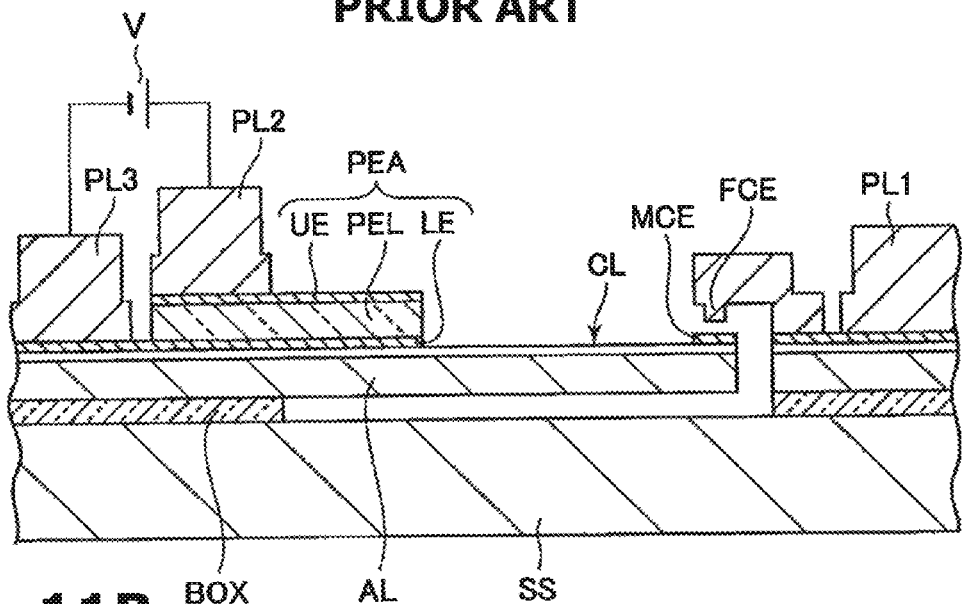
FIGS. 11A, 11B, and 11C are cross-sectional views illustrating an example of a MEMS switch having a unimorph type piezoelectric drive element according to the prior art.
Figure 11B:
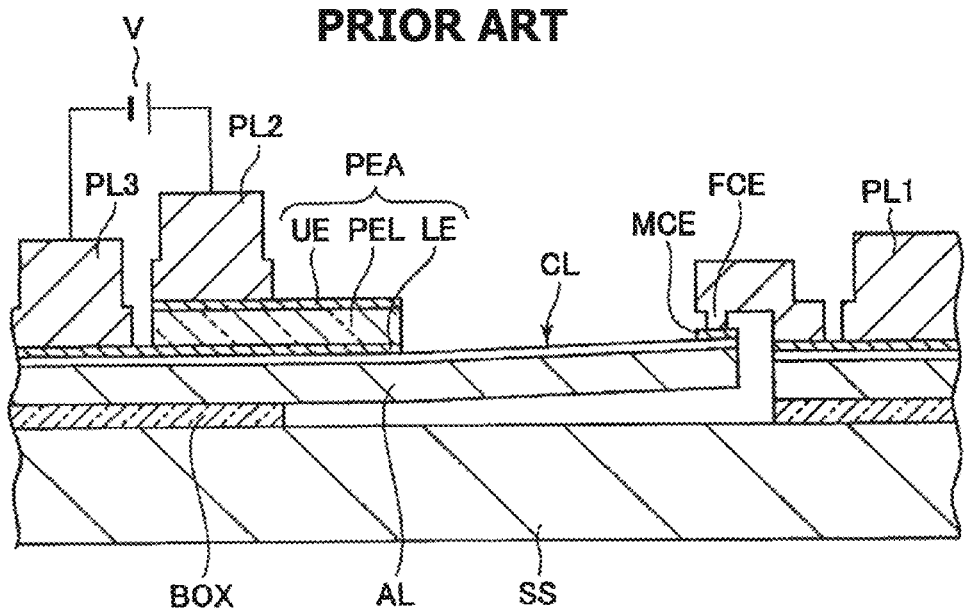
Figure 11C:
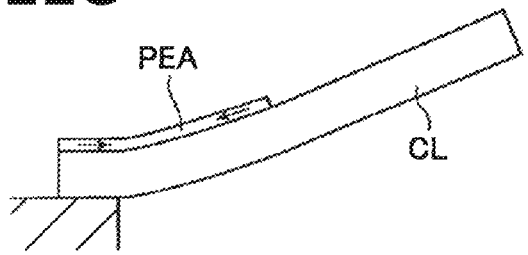
Figure 12:
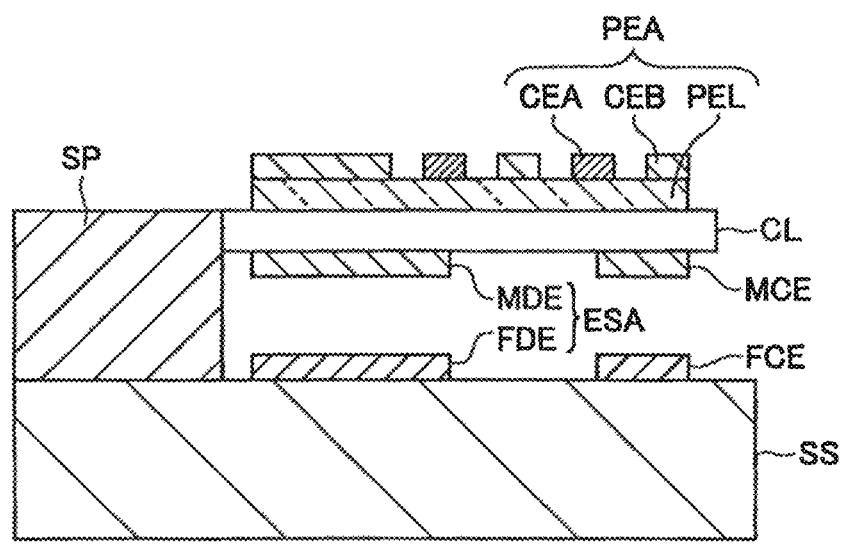
FIG. 12 is a cross-sectional view illustrating a MEMS switch having a hybrid drive mechanism according to the prior art.

FIGS. 10A and 10B are a cross-sectional view and a plan view, illustrating a MEMS switch according to the second embodiment. The flexible beam of this embodiment is a cantilever beam. A pair of raising actuators RA1 and RA2 are disposed along both sides of the flexible beam FB, extending from above the support SP1 to an intermediate position of the flexible beam FB, with wirings for the lowering actuators and movable contact disposed between them. Regarding the longitudinal direction of the flexible beam FB, a pair of lowering actuators DA1 and DA2 are disposed along both sides of the flexible beam FB in a region containing the movable contact. Since the flexible beam is a cantilever beam, when raising actuators RA1 and RA2 are driven, the far (free) end of the flexible beam is raised as illustrated in FIG. 1C. The motion of the lowering actuators DA deforms the beam to become downwardly convex with a central portion projecting downward as illustrated in FIG. 1E.

Materials and numerical values disclosed in the above embodiments are for illustrative purposes only, and have no restrictive significance. A Ti or other adhesion film may be formed between the Pt lower electrode and the underlying layer. As the piezoelectric material, as well as PZT, other piezoelectric materials, such as PLZT or PNN-PT-PZ, may also be used. The electrode material for piezoelectric driver is not limited to Pt. Namely, non-oxidizable noble metal or oxidizable and still electrically conductive noble metal may be used. The material for the flexible beam is not limited to single crystal Si. Namely, it will also be possible to use metal glass or the like. None of the illustrated processes are restrictive. Reference may be made, for example, to JPA No. 2006-261515 and JPA No. 2007-257807, which are incorporated herein by reference. It will be apparent to those skilled in the art that a variety of other modifications, substitutions, improvements, combinations and the like are possible.

What we claim are:

1. A MEMS switch comprising:
   fixed support;
   a plate-shaped flexible beam extending along a first direction having at least one end immovably supported by the fixed support and having an extending movable surface;
   a movable electric contact disposed on the movable surface of the flexible beam;
   a fixed electric contact disposed above the movable electric contact, facing the movable electric contact and disposed at a fixed position relative to the fixed support;
   first piezoelectric driver disposed above the movable surface of the flexible beam, extending along the first direction from a portion above the fixed support towards the movable electric contact, and capable of displacing the movable electric contact towards the fixed electric contact by voltage driving; and
   second piezoelectric driver disposed at least on the movable surface of the flexible beam in a region containing the movable contact and extending along the first direction, capable of so driving a movable part of the flexible beam by voltage driving that the movable electric contact is separated from the fixed electric contact;
   wherein either of the first piezoelectric driver and the second piezoelectric driver has a lower electrode, a piezoelectric material layer disposed on the lower electrode, and an upper electrode disposed on the piezoelectric material layer,
   wherein the movable electric contact is disposed in an intermediate-width region of the flexible beam and the second piezoelectric driver includes a pair of piezoelectric actuators disposed on both outer-width sides of the movable electric contact, and
   wherein the fixed support comprises an SOI substrate in which an active Si layer is bonded to an Si support substrate via a silicon oxide layer, and
   the flexible beam comprises part of the active Si layer and has a stripe shape having a constant width and extending in a longitudinal direction.

2. A MEMS switch according to claim 1, wherein the flexible beam has a both-ends supported beam structure and the movable electric contact and the second piezoelectric driver are disposed in an intermediate region between two ends of the both-ends supported beam.

3. A MEMS switch according to claim 1, wherein the flexible beam has a cantilever beam structure and the movable electric contact and second piezoelectric driver are disposed in vicinity of free end of the cantilever beam.

4. A MEMS switch according to claim 1, further comprising:
   a first control circuit that controls the first piezoelectric driver; and
   a second control circuit that controls the second piezoelectric driver.

5. A MEMS switch according to claim 4, wherein the first control circuit and the second control circuit are coupled through mutual induction.

6. A MEMS switch according to claim 4, further comprising a microprocessor that controls the first control circuit and the second control circuit.

7. A MEMS switch according to claim 6, further comprising a counter that counts number of operations of the first control circuit and the microprocessor activates the second control circuit once in response to a plural times of activation of the first control circuit.

* * * * *